US006912675B2

(12) United States Patent
Swoboda

(10) Patent No.: US 6,912,675 B2
(45) Date of Patent: Jun. 28, 2005

(54) USING SELECTIVE OMISSION TO COMPRESS ON-CHIP DATA PROCESSOR TRACE AND TIMING INFORMATION FOR EXPORT

(75) Inventor: Gary L. Swoboda, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 831 days.

(21) Appl. No.: 09/943,137

(22) Filed: Aug. 30, 2001

(65) Prior Publication Data

US 2002/0065642 A1 May 30, 2002

Related U.S. Application Data

(62) Division of application No. 09/798,561, filed on Mar. 2, 2001.
(60) Provisional application No. 60/186,326, filed on Mar. 2, 2000, and provisional application No. 60/219,340, filed on Mar. 2, 2000.

(51) Int. Cl.[7] .............................................. G06F 11/00
(52) U.S. Cl. ............................. 714/45; 714/28; 703/23; 703/28
(58) Field of Search ...................... 714/45, 28; 703/23, 703/28, 26; 709/236

(56) References Cited

U.S. PATENT DOCUMENTS

| 5,493,723 | A | * | 2/1996 | Beck et al. | .................... 703/28 |
| 5,657,442 | A | * | 8/1997 | Groves | ........................ 714/28 |
| 6,038,231 | A | * | 3/2000 | Dolby et al. | ................. 370/394 |
| 6,263,301 | B1 | * | 7/2001 | Cox et al. | ..................... 703/14 |
| 2002/0055831 | A1 | * | 5/2002 | Swoboda | ..................... 703/19 |

OTHER PUBLICATIONS

ARM Limited, RDI 1.5.1bx and RDI 1.5.1rt; Doc. No. RDI–0032–CUST–ESPC–A; May 19, 2000; pp. 1–55.
ARM Limited, ETM9, Rev. 1, Technical Reference Manual, Doc. No. DDI 0157C, pp. 1–Index–3.
ARM Limited, Embedded Trace Macrocell, Rev. 1, Specification, Doc. No. IHI 0014E, pp. 1–Index–3.

* cited by examiner

Primary Examiner—Robert Beausoliel
Assistant Examiner—Yolanda Wilson
(74) Attorney, Agent, or Firm—Robert D. Marshall, Jr.; W. James Brady, III; Frederick J. Telecky, Jr.

(57) ABSTRACT

Parameter values of an emulation parameter that is indicative of a data processing operation performed by a data processor are exported from the data processor. In response to detection of a condition wherein a first portion of a first parameter value is identical to a corresponding portion of a second parameter value, the second parameter value and only a remainder portion of the first parameter value other than the first portion are output from the data processor.

30 Claims, 10 Drawing Sheets

| OPCODE | COMMAND MEANING |
|---|---|
| 00 0000 0000 | NO INFORMATION |
| 00 0000 0001 | RESERVED |
| 00 0000 0010 | PC TRACE GAP |
| 00 0000 0011 | REPEAT INSTRUCTION |
| 00 0000 0100 | COUNTER START |
| 00 0000 0101 | COUNTER OVERFLOW/COUNTER VALUE |
| 00 0000 0110 | RESERVED |
| 00 0000 0111 | COMMAND ESCAPE |
| 00 0000 1xxx | EXCEPTION OCCURRED |
| 00 0001 0xxx | TIMING SYNC POINT |
| 00 0001 1xxx | MEMORY REFERENCE SYNC POINT |
| 00 0010 xxxx | PC SYNC POINT/FIRST/LAST/TRIGGER |
| 00 010x xxxx | SAME PC |
| 00 011x xxxx | CPU AND ASIC DATA |
| 00 10xx xxxx | RESERVED |
| 00 11xx xxxx | MEMORY REFERENCE BLOCK |
| 01 xxxx xxxx | BRANCH/BEGINNING OF PARAMETER |
| 10 xxxx xxxx | CONTINUE |
| 11 xxxx xxxx | TIMING |

*FIG. 3*

TIMING PACKET EXAMPLES

| OPCODE | CYCLE BITS | MEANING |
|---|---|---|
| 11 | 00000000 | 8 CONSECUTIVE CYCLES OF EXECUTION |
| 11 | 11111111 | 8 CONSECUTIVE STALL CYCLES |
| 11 | 11110000 | THE RIGHT MOST BITS INDICATE THE PROCESSOR EXECUTED FOR 4 CYCLES AND THEN STALLED 4 CYCLES |
| 11 | 10101010 | THE BITS MEAN EXECUTE, STALL, EXECUTE, STALL, EXECUTE, STALL, EXECUTE, STALL, EXECUTE, AND STALL RESPECTIVELY |

*FIG. 4*

TIMING SYNC PACKET

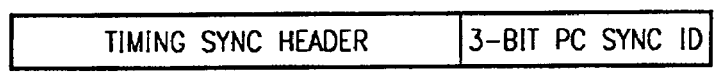

*FIG. 5*

PC SYNC POINT TYPES
| TYPE | SYNC TYPE | REASON FOR SYNC POINT |
|---|---|---|
| 000 | TRIGGER | USER DEFINED TRIGGER |
| 001 | FIRST POINT | STANDBY MODE |
| 010 | SYNC POINT | PERIODICALLY GENERATED |
| 011 | FIRST POINT | STREAM ENABLED |
| 100 | LAST POINT | STREAM DISABLED |
*FIG. 6*
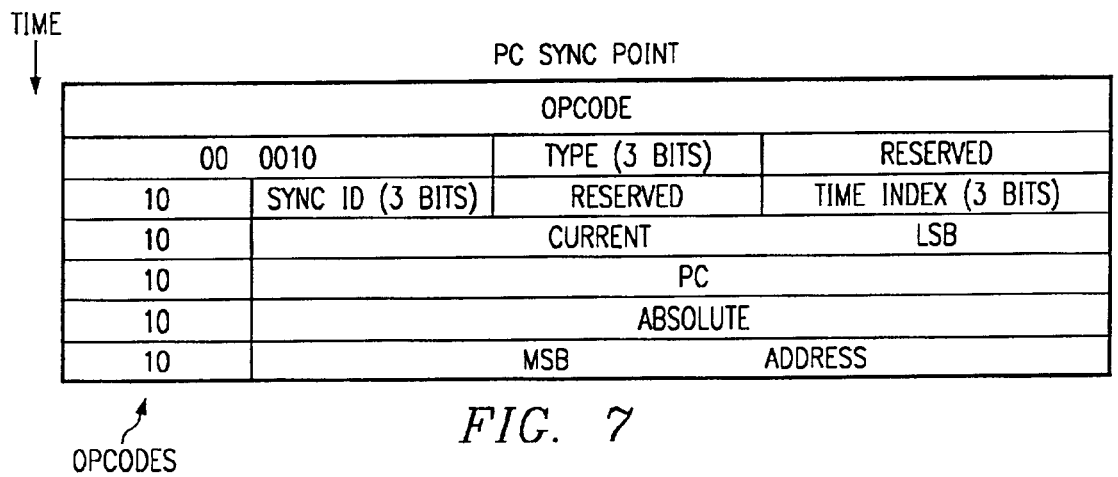
*FIG. 7*
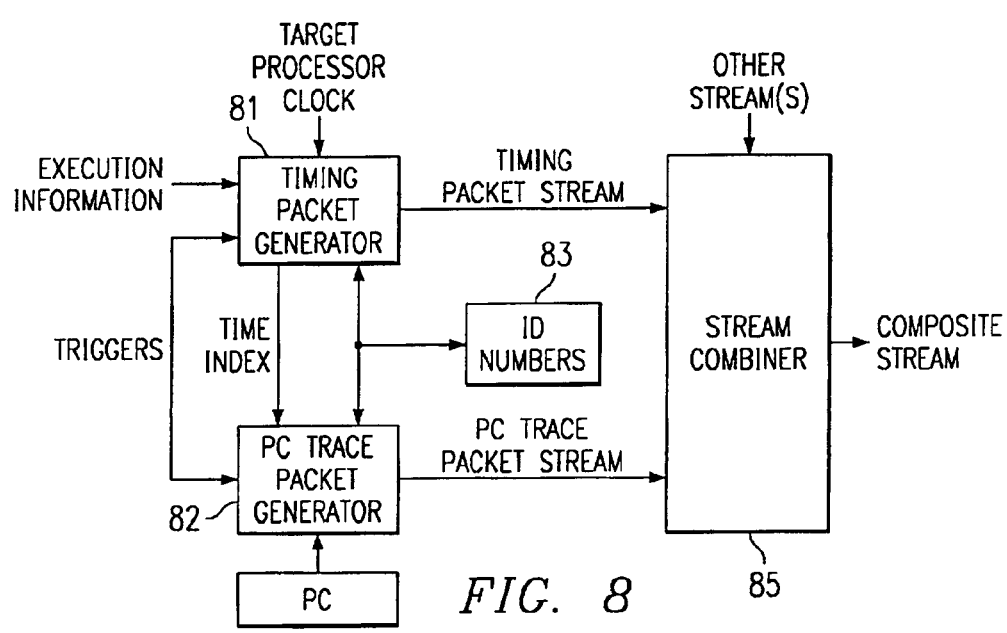
*FIG. 8*

| PACKET SEQUENCE | | | |
|---|---|---|---|
| 0011 | LD/ST (1 BIT) | DATA, ADDRESS, PC (5 BITS) | |
| 01 | DATA BYTE 0 LSB | | |
| 10 | DATA BYTE 1 | | |
| 10 | DATA BYTE 2 | | |
| 10 | DATA BYTE 3 | | |
| 10 | DATA BYTE 4 | | |
| 10 | DATA BYTE 5 | | |
| 10 | DATA BYTE 6 | | |
| 10 | MSB DATA BYTE 7 | | |
| 01 | DATA ADDRESS BYTE 0 LSB | | |
| 10 | DATA ADDRESS BYTE 1 | | |
| 10 | DATA ADDRESS BYTE 2 | | |
| 10 | MSB DATA ADDRESS BYTE 3 | | |
| 01 | NATIVE PC ADDRESS BYTE 0 LSB | OR | OFFSET, BITS 7-0 (8 BITS) |
| 10 | NATIVE PC ADDRESS BYTE 1 | | OFFSET, BITS 15-8 (8 BITS) (OPTIONAL) |
| 10 | NATIVE PC ADDRESS BYTE 2 | | NOT NEEDED |
| 10 | MSB NATIVE PC ADDRESS BYTE 3 | | NOT NEEDED |

TIME ↓

OPCODES

*FIG. 9*

MEMORY REFERENCE SYNC POINT

| OPCODE | PARAMETER FIELD (3-BITS) |
|---|---|
| 00 00011 | MSB SYNC ID LSB |

*FIG. 10*

| COMPRESSION EXAMPLE 0 | |
|---|---|
| PREVIOUS DATA | 11111111 11111111 11111111 10000011 |
| NEW DATA | 11111111 11111111 11111111 10000011 |
| COMPRESSION BIT MAP SENT | NONE BECAUSE ONLY ONE BYTE COMPRESSES |
| SEND BYTES | DROPPED DROPPED DROPPED SENT |
| | BYTE #0 IS SENT |

*FIG. 14*

| COMPRESSION EXAMPLE 1 | |
|---|---|
| PREVIOUS DATA | 11111111 11111111 11111111 10000011 |
| NEW DATA | 11111111 11111111 11111111 10000100 |
| COMPRESSION BIT MAP SENT | NO BECAUSE ONLY ONE BYTE COMPRESSES |
| SEND BYTES | DROPPED DROPPED DROPPED SENT |
| | BYTE #0 IS SENT |

*FIG. 15*

| COMPRESSION EXAMPLE 2 | |
|---|---|
| PREVIOUS DATA | 11101111 11101111 11101111 10000011 |
| NEW DATA | 11101111 11101111 11101111 10000100 |
| COMPRESSION BIT MAP SENT | YES BECAUSE NO SIGN EXTENSION AND TWO OR MORE BYTES COMPRESS |
| SEND BYTES | DROPPED DROPPED DROPPED SENT |
| | BYTE #0 IS SENT |

*FIG. 16*

| COMPRESSION EXAMPLE 3 | |
|---|---|
| PREVIOUS DATA | 00001000 01111110 11000011 10000100 |
| NEW DATA | 11111111 11111111 11000011 10000100 |
| COMPRESSION BIT MAP SENT | YES BECAUSE NO SIGN EXTENSION AND TWO OR MORE BYTES COMPRESS |
| SEND BYTES | DROPPED DROPPED DROPPED DROPPED |
| | NO BYTES ARE SENT |

*FIG. 17*

| COMPRESSION EXAMPLE 4 | |
|---|---|
| PREVIOUS DATA | 10000011 00000100 11111111 11111111 |
| NEW DATA | 11111111 11111111 11111111 11111111 |
| COMPRESSION BIT MAP SENT | YES BECAUSE TWO OR MORE BYTES NOT COVERED BY SIGN EXTENSION COMPRESS |
| SEND BYTES | DROPPED  DROPPED  DROPPED  DROPPED |
|  | NO BYTES ARE SENT |

FIG. 18

TIME ↓

| 00 | DATA HEADER | 190 |
| 10 | DATA COMPRESSION MAP BYTE (8 BITS) = 11011001 | 192 |
| 01 | LSB DATA BYTE 0 (NOT SENT) | |
| 10 | DATA BYTE 1 (SENT) | |
| 10 | DATA BYTE 2 (SENT) | |
| 10 | DATA BYTE 3 (NOT SENT) | |
| 10 | DATA BYTE 4 (NOT SENT) | |
| 10 | DATA BYTE 5 (SENT) | |
| 10 | DATA BYTE 6 (NOT SENT) | |
| 10 | MSB DATA BYTE 7 (NOT SENT) | |

OPCODES

FIG. 19

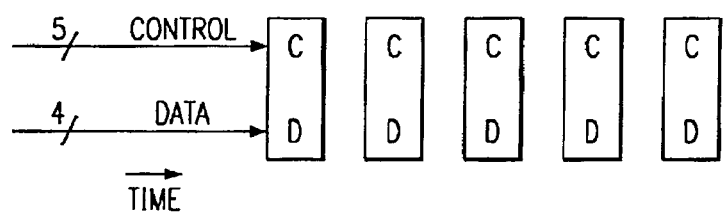

FIG. 20
(PRIOR ART)

| 6 TRACE PACKETS TRANSMITTED AS 10 TRANSMISSION PACKETS | | | | | | | | | |
|---|---|---|---|---|---|---|---|---|---|
| 10 | | 10 | | 10 | | 10 | | 10 | 10 |
| 6 | 6 | 6 | 6 | 6 | 6 | 6 | 6 | 6 | 6 |
| TIME → | | | | | | | | | |

*FIG. 23*

| 10 | 10 | 10 | 10 | 10 | 10 |
|---|---|---|---|---|---|
| 12 | | 12 | 12 | 12 | 12 |

*FIG. 23A*

| 10 | 10 | 10 | 10 | 10 | 10 | 10 | 10 |
|---|---|---|---|---|---|---|---|
| 16 | | 16 | | 16 | | 16 | 16 |

*FIG. 23B*

REGISTER 221            REGISTER 222

| # | CURRENT TRANSMISSION PACKET | | | | | | | | | | # | INCOMPLETE TRANSMISSION PACKET | | | | | | | | | |
|---|---|---|---|---|---|---|---|---|---|---|---|---|---|---|---|---|---|---|---|---|---|
| 0 | 9 | 8 | 7 | 6 | 5 | 4 | 3 | 2 | 1 | 0 | | EMPTY | | | | | | | | | |
| 1 | 9 | 8 | 7 | 6 | 5 | 4 | 3 | 2 | 1 | 0 | 0 | 9 | 8 | 7 | 6 | 5 | 4 | 3 | 2 | 1 | 0 |
| 1 | 9 | 8 | 7 | 6 | 5 | 4 | 3 | 2 | 1 | 0 | 1 | 9 | 8 | 7 | 6 | 5 | 4 | 3 | 2 | 1 | 0 |
| 2 | 9 | 8 | 7 | 6 | 5 | 4 | 3 | 2 | 1 | 0 | 1 | 9 | 8 | 7 | 6 | 5 | 4 | 3 | 2 | 1 | 0 |
| 2 | 9 | 8 | 7 | 6 | 5 | 4 | 3 | 2 | 1 | 0 | 2 | 9 | 8 | 7 | 6 | 5 | 4 | 3 | 2 | 1 | 0 |
| 3 | 9 | 8 | 7 | 6 | 5 | 4 | 3 | 2 | 1 | 0 | 2 | 9 | 8 | 7 | 6 | 5 | 4 | 3 | 2 | 1 | 0 |

USING SELECTIVE OMISSION TO COMPRESS ON-CHIP DATA PROCESSOR TRACE AND TIMING INFORMATION FOR EXPORT

This application is a divisional of copending U.S. Ser. No. 09/798,561 filed on Mar. 2, 2001 and incorporated herein by reference. U.S. Ser. No. 09/798,561 claims the priority under 35 U.S.C. 119(e)(1) of the following now abandoned U.S. provisional applications: 60/186,326 filed on Mar. 2, 2000; and 60/219,340 originally filed on Mar. 2, 2000 as non-provisional U.S. Ser. No. 09/515,093 and thereafter converted to provisional application status by a petition granted on Aug. 18, 2000.

FIELD OF THE INVENTION

The invention relates generally to electronic data processing and, more particularly, to emulation, simulation and test capabilities of electronic data processing devices and systems.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive realtime debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patters would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large of subsequent design time is expended on test pattern creation and upgrading.

Even if a significant investment were made to design a module to be reusable and to fully create and grade its test patterns, subsequent use of the module may bury it in application specific logic, and make its access difficult or impossible. Consequently, it is desirable to avoid this pitfall.

The advances of IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

Emulation technology utilizing scan based emulation and multiprocessing debug was introduced over 10 years ago. In 1988, the change from conventional in circuit emulation to scan based emulation was motivated by design cycle time pressures and newly available space for on-chip emulation. Design cycle time pressure was created by three factors: higher integration levels—such as on-chip memory; increasing clock rates—caused electrical intrusiveness by emulation support logic; and more sophisticated packaging—created emulator connectivity issues.

Today these same factors, with new twists, are challenging a scan based emulator's ability to deliver the system debug facilities needed by today's complex, higher clock rate, highly integrated designs. The resulting systems are smaller, faster, and cheaper. They are higher performance with footprints that are increasingly dense. Each of these positive system trends adversely affects the observation of system activity, the key enabler for rapid system development. The effect is called "vanishing visibility."

Application developers prefer visibility and control of all relevant system activity. The steady progression of integration levels and increases in clock rates steadily decrease the visibility and control available over time. These forces create a visibility and control gap, the difference between the desired visibility and control level and the actual level available. Over time, this gap is sure to widen. Application development tool vendors are striving to minimize the gap growth rate. Development tools software and associated hardware components must do more with less and in different ways; tackling the ease of use challenge is amplified by these forces.

With today's highly integrated System-On-a-Chip (SOC) technology, the visibility and control gap has widened dramatically. Traditional debug options such as logic analyzers and partitioned prototype systems are unable to keep pace with the integration levels and ever increasing clock rates of today's systems.

As integration levels increase, system buses connecting numerous subsystem components move on chip, denying traditional logic analyzers access to these buses. With limited or no significant bus visibility, tools like logic analyzers cannot be used to view system activity or provide the trigger mechanisms needed to control the system under development. A loss of control accompanies this loss in visibility, as it is difficult to control things that are not accessible.

To combat this trend, system designers have worked to keep these buses exposed, building system components in way that enabled the construction of prototyping systems with exposed buses. This approach is also under siege from the ever-increasing march of system clock rates. As CPU clock rates increase, chip to chip interface speeds are not keeping pace. Developers find that a partitioned system's performance does not keep pace with its integrated counterpart, due to interface wait states added to compensate for lagging chip to chip communication rates. At some point, this performance degradation reaches intolerable levels and the partitioned prototype system is no longer a viable debug option. We have entered an era where production devices must serve as the platform for application development.

Increasing CPU clock rates are also accelerating the demise of other simple visibility mechanisms. Since the CPU clock rates can exceed maximum I/O state rates, visibility ports exporting information in native form can no longer keep up with the CPU. On-chip subsystems are also operated at clock rates that are slower than the CPU clock rate. This approach may be used to simplify system design and reduce power consumption. These developments mean simple visibility ports can no longer be counted on to deliver a clear view of CPU activity.

As visibility and control diminish, the development tools used to develop the application become less productive. The tools also appear harder to use due to the increasing tool complexity required to maintain visibility and control. The visibility, control, and ease of use issues created by systems-on-a-chip are poised to lengthen product development cycles.

Even as the integration trends present developers with a difficult debug environment, they also present hope that new approaches to debug problems will emerge. The increased densities and clock rates that create development cycle time pressures also create opportunities to solve them.

On-chip, debug facilities are more affordable than ever before. As high speed, high performance chips are increasingly dominated by very large memory structures, the system cost associated with the random logic accompanying the CPU and memory subsystems is dropping as a percentage of total system cost. The cost of a several thousand gates is at an all time low, and can in some cases be tucked into a corner of today's chip designs. Cost per pin in today's high density packages has also dropped, making it easier to allocate more pins for debug. The combination of affordable gates and pins enables the deployment of new, on-chip emulation facilities needed to address the challenges created by systems-on-a-chip.

When production devices also serve as the application debug platform, they must provide sufficient debug capabilities to support time to market objectives. Since the debugging requirements vary with different applications, it is highly desirable to be able to adjust the on-chip debug facilities to balance time to market and cost needs.

Since these on-chip capabilities affect the chip's recurring cost, the scalability of any solution is of primary importance. "Pay only for what you need" should be the guiding principle for on-chip tools deployment. In this new paradigm, the system architect may also specify the on-chip debug facilities along with the remainder of functionality, balancing chip cost constraints and the debug needs of the product development team.

The emulation technology of the present invention uses the debug upside opportunities noted above to provide developers with an arsenal of debug capability aimed at narrowing the control and visibility gap.

This emulation technology delivers solutions to the complex debug problems of today's highly integrated embedded real-time systems. This technology attacks the loss of visibility, control, and ease of use issues described in the preceding section while expanding the feature set of current emulators.

The on-chip debug component of the present invention provides a means for optimizing the cost and debug capabilities. The architecture allows for flexible combinations of emulation components or peripherals tailored to meet system cost and time to market constraints. The scalability aspect makes it feasible to include them in production devices with manageable cost and limited performance overhead.

According to the invention, parameter values of an emulation parameter that is indicative of a data processing operation performed by a data processor are exported from the data processor. In response to detection of a condition wherein a first portion of a first parameter value is identical to a corresponding portion of a second parameter value, the second parameter value and only a remainder portion of the first parameter value other than the first portion are output from the data processor.

BRIEF DESCRIPTION OF THE DRAWINGS

FIG. 3 illustrates an exemplary trace packet format according to the invention.

FIG. 4 illustrates exemplary timing packets according to the invention.

FIG. 5 illustrates a timing sync packet according to the invention.

FIG. 6 illustrates exemplary portions of a PC sync point command according to the invention.

FIG. 7 illustrates an exemplary PC sync point according to the invention.

FIG. 8 diagrammatically illustrates pertinent portions of exemplary embodiments of the trace collector of FIG. 2.

FIG. 9 illustrates an exemplary memory reference command according to the invention.

FIG. 10 illustrates an exemplary memory reference sync point according to the invention.

FIGS. 13–19 illustrate exemplary operations which can be performed by the data compressor of FIG. 12.

FIG. 20 illustrates a prior art approach to exporting emulation control information and emulation data from a target chip to a emulator.

FIGS. 23–27 illustrate exemplary operations which can be performed by the transmission formatter of FIGS. 22 and FIG. 22A.

DETAILED DESCRIPTION

Figure 1:
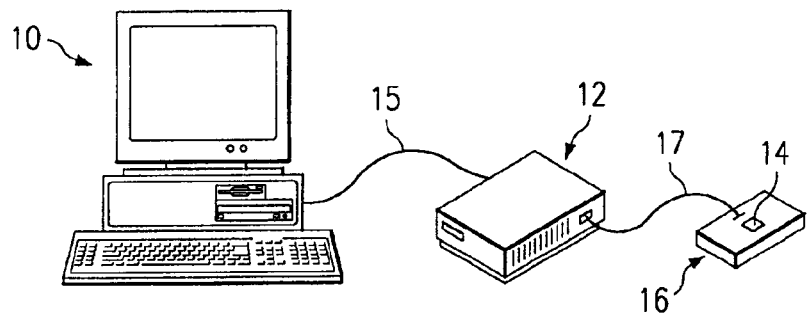
FIG. 1 diagrammatically illustrates exemplary embodiments of an emulation system according to the invention.

Emulation, debug, and simulation tools of the present invention are described herein. The emulation and debug solutions described herein are based on the premise that, over time, some if not most debug functions traditionally performed off chip must be integrated into the production device if they are to remain in the developer's debug arsenal. To support the migration of debug functions on chip, the present invention provides a powerful and scalable portfolio of debug capabilities for on-chip deployment. This technology preserves all the gains of initial JTAG technology while adding capabilities that directly assault the visibility, control, and ease of use issues created by the vanishing visibility trend.

Four significant architectural infrastructure components spearhead the assault on the control and visibility gap described earlier herein:

1. Real-time Emulation (RTE);
2. Real-time Data Exchange (RTDX);
3. Trace; and
4. Advanced Analysis.

These components address visibility and control needs as shown in Table 1.

accessed in real-time with no impact to interrupt processing. Users may distinguish between real-time and non real-time interrupts, and mark code that must not be disturbed by real-time debug memory accesses. This base emulation capability includes hardware that can be configured as two single point hardware breakpoints, a single data watchpoint, an event counter, or a data logging mechanism. The EMU pin capability includes trigger I/Os for multiprocessor event processing and a uni-directional (target to host) data logging mechanism.

RTDX™ provides real-time data transfers between an emulator host and target application. This component offers both bi-directional and unidirectional DSP target/host data transfers facilitated by the emulator. The DSP (or target) application may collect target data to be transferred to the host or receive data from the host, while emulation hardware (within the DSP and the emulator) manages the actual transfer. Several RTDX transfer mechanisms are supported, each providing different levels of bandwidth and pin utilization allowing the trade off of gates and pin availability against bandwidth requirements.

Trace is a non-intrusive mechanism of providing visibility of the application activity. Trace is used to monitor CPU related activity such as program flow and memory accesses, system activity such as ASIC state machines, data streams and CPU collected data. Historical trace technology also used logic analyzer like collection and special emulation (SEs) devices with more pins than a production device. The logic analyzer or like device processed native representations of the data using a state machine like programming interface (filter mechanism). This trace model relied on all activity being exported with external triggering selecting the data that needed to be stored, viewed and analyzed.

Existing logic analyzer like technology does not, however, provide a solution to decreasing visibility due to

TABLE 1

Emulation System Architecture and Usage

| Architectural Component | Visibility Provisions | Control Provisions | Debug Usage |
| --- | --- | --- | --- |
| RTE | Static view of the CPU and memory state after background program is stopped. Interrupt driven code continues to execute. | Analysis components are used to stop execution of background program. | Basic debug Computational problems Code design problems |
| RTDX | Debugger software interacts with the application code to exchange commands and data while the application continues to execute. | Analysis components are used to identify observation points and interrupt program flow to collect data. | Dynamic instrumentation Dynamic variable adjustments Dynamic data collection |
| Trace | Bus snooper hardware collects selective program flow and data transactions for export without interacting with the application. | Analysis components are used to define program segments and bus transactions that are to be recorded for export. | Prog. Flow corruption debug Memory corruption Benchmarking Code Coverage Path Coverage Program timing problems |
| Analysis | Allows observation of occurrences of events or event sequences. Measure elapsed time between events. Generate external triggers. | Alter program flow after the detection of events or event sequences. | Benchmarking Event/sequence identification Ext. trigger generation Stop program execution Activate Trace and RTDX |

Real-Time Emulation (RTE) provides a base set of fixed capabilities for real-time execution control (run, step, halt, etc.) and register/memory visibility. This component allows the user to debug application code while real-time interrupts continue to be serviced. Registers and memory may be higher integration levels, increasing clock rates and more sophisticated packaging. In this model, the production device must provide visibility through a limited number of pins. The data exported is encoded or compressed to reduce the export bandwidth required. The recording mechanism becomes a pure recording device, packing exported data into a deep trace memory. Trace software is used to convert the recorded data into a record of system activity.

On-chip Trace with high speed serial data export, in combination with Advanced Analysis provides a solution for SOC designs. Trace is used to monitor CPU related activity such as program flow and memory accesses, system activity such as ASIC state machines, data streams etc. and CPU collected data. This creates four different classes of trace data:

Program flow and timing provided by the DSP core (PC trace);

Memory data references made by the DSP core or chip level peripherals (Data reads and writes);

Application specific signals and data (ASIC activity); and

CPU collected data.

Collection mechanisms for the four classes of trace data are modular allowing the trade off of functionality verses gates and pins required to meet desired bandwidth requirements.

The RTDX and Trace functions provide similar, but different forms of visibility. They differ in terms of how data is collected, and the circumstances under which they would be most effective. A brief explanation is included below for clarity:

RTDX™ (Real Time Data eXchange) is a CPU assisted solution for exchanging information; the data to be exchanged have a well-defined behavior in relation to the program flow. For example, RTDX can be used to record the input or output buffers from a DSP algorithm. RTDX requires CPU assistance in collecting data hence there is definite, but small, CPU bandwidth required to accomplish this. Thus, RTDX is an application intrusive mechanism of providing visibility with low recurring overhead cost.

Trace is a non-intrusive, hardware-assisted collection mechanism (such as, bus snoopers) with very high bandwidth (BW) data export. Trace is used when there is a need to export data at a very high data rate or when the behavior of the information to be traced is not known, or is random in nature or associated with an address. Program flow is a typical example where it is not possible to know the behavior a priori. The bandwidth required to export this class of information is high. Data trace of specified addresses is another example. The bandwidth required to export data trace is very high.

Trace data is unidirectional, going from target to host only. RTDX can exchange data in either direction although unidirectional forms of RTDX are supported (data logging). The Trace data path can also be used to provide very high speed unidirectional RTDX (CPU collected trace data).

The high level features of Trace and RTDX are outlined in Table 2.

TABLE 2

RTDX and Trace Features

| Features | RTDX ™ | Trace |
| --- | --- | --- |
| Bandwidth/pin | Low | High |
| Intrusiveness | Intrusive | Non-intrusive |
| Data Exchange | Bi-directional or uni-directional | Export only |
| Data collection | CPU assisted | CPU or Hardware assisted |
| Data transfer | No extra hardware for minimum BW (optional hardware for higher BW) | Hardware assisted |
| Cost | Relatively low recurring cost | Relatively high recurring cost |

Advanced analysis provides a non-intrusive on-chip event detection and trigger generation mechanism. The trigger outputs created by advanced analysis control other infrastructure components such as Trace and RTDX. Historical trace technology used bus activity exported to a logic analyzer to generate triggers that controlled trace within the logic analyzer unit or generated triggers which were supplied to the device to halt execution. This usually involved a chip that had more pins than the production device (an SE or special emulation device). This analysis model does not work well in the System-on-a-Chip (SOC) era as the integration levels and clock rates of today's devices preclude full visibility bus export.

Advanced analysis provides affordable on-chip instruction and data bus comparators, sequencers and state machines, and event counters to recreate the most important portions of the triggering function historically found off chip. Advanced analysis provides the control aspect of debug triggering mechanism for Trace, RTDX and Real-Time Emulation. This architectural component identifies events, tracks event sequences, and assigns actions based on their occurrence (break execution, enable/disable trace, count, enable/disable RTDX, etc.). The modular building blocks for this capability include bus comparators, external event generators, state machines or state sequencers, and trigger generators. The modularity of the advanced analysis system allows the trade off of functionality versus gates.

Emulator capability is created by the interaction of four emulator components:

debugger application program;

host computer;

emulation controller; and on-chip debug facilities.

These components are connected as shown in FIG. 1. The host computer 10 is connected to an emulation controller 12 (external to the host) with the emulation controller (also referred to herein as the emulator or the controller) also connected to the target system 16. The user preferably controls the target application through a debugger application program, running on the host computer, for example, Texas Instruments' Code Composer Studio program.

A typical debug system is shown in FIG. 1. This system uses a host computer 10 (generally a PC) to access the debug capabilities through an emulator 12. The debugger application program presents the debug capabilities in a user-friendly form via the host computer. The debug resources are allocated by debug software on an as needed basis, relieving the user of this burden. Source level debug utilizes the debug resources, hiding their complexity from the user. The debugger together with the on-chip Trace and triggering facilities provide a means to select, record, and display chip activity of interest. Trace displays are automatically correlated to the source code that generated the trace log. The emulator provides both the debug control and trace recording function.

The debug facilities are programmed using standard emulator debug accesses through the target chips' JTAG or similar serial debug interface. Since pins are at a premium, the technology provides for the sharing of the debug pin pool by trace, trigger, and other debug functions with a small increment in silicon cost. Fixed pin formats are also supported. When the sharing of pins option is deployed, the debug pin utilization is determined at the beginning of each debug session (before the chip is directed to run the application program), maximizing the trace export bandwidth. Trace bandwidth is maximized by allocating the maximum number of pins to trace.

The debug capability and building blocks within a system may vary. The emulator software therefore establishes the configuration at run-time. This approach requires the hardware blocks to meet a set of constraints dealing with configuration and register organization. Other components provide a hardware search capability designed to locate the blocks and other peripherals in the system memory map. The emulator software uses a search facility to locate the resources. The address where the modules are located and a type ID uniquely identifies each block found. Once the IDs are found, a design database may be used to ascertain the exact configuration and all system inputs and outputs.

The host computer is generally a PC with at least 64 Mbytes of memory and capable of running at least Windows95, SR-2, Windows NT, or later versions of Windows. The PC must support one of the communications interfaces required by the emulator, for example:

Ethernet 10T and 100T, TCP/IP protocol;

Universal Serial Bus (USB), rev 1.x;

Firewire, IEEE 1394; and/or

Parallel Port (SPP, EPP, and ECP).

The emulation controller 12 provides a bridge between the host computer 10 and target system 16, handling all debug information passed between the debugger application running on the host computer and a target application executing on a DSP (or other target processor) 14.

One exemplary emulator configuration supports all of the following capabilities:

Real-time Emulation;

RTDX;

Trace; and

Advanced Analysis.

Additionally, the emulator-to-target interface supports:

Input and output triggers;

Bit I/O; and

Managing special extended operating modes.

The emulation controller 12 accesses Real-time Emulation capabilities (execution control, memory, and register access) via a 3, 4, or 5 bit scan based interface. RTDX capabilities can be accessed by scan or by using three higher bandwidth RTDX formats that use direct target-to-emulator connections other than scan. The input and output triggers allow other system components to signal the chip with debug events and vice-versa.

The emulator 12 is partitioned into communication and emulation sections. The communication section supports communication with the host 10 on host communication links while the emulation section interfaces to the target, managing target debug functions and the device debug port. The emulator 12 communicates with the host computer 10 using e.g., one of the aforementioned industry standards communication links at 15. The host-to-emulator connection can be established with off the shelf cabling technology. Host-to-emulator separation is governed by the standards applied to the interface used.

The emulation controller 12 communicates with the target system 16 through a target cable or cables at 17. Debug, Trace, Triggers, and RTDX capabilities share the target cable, and in some cases, the same device pins. More than one target cable may be required when the target system deploys a trace width that cannot be accommodated in a single cable. All trace, RTDX, and debug communication occurs over this link.

Figure 2:
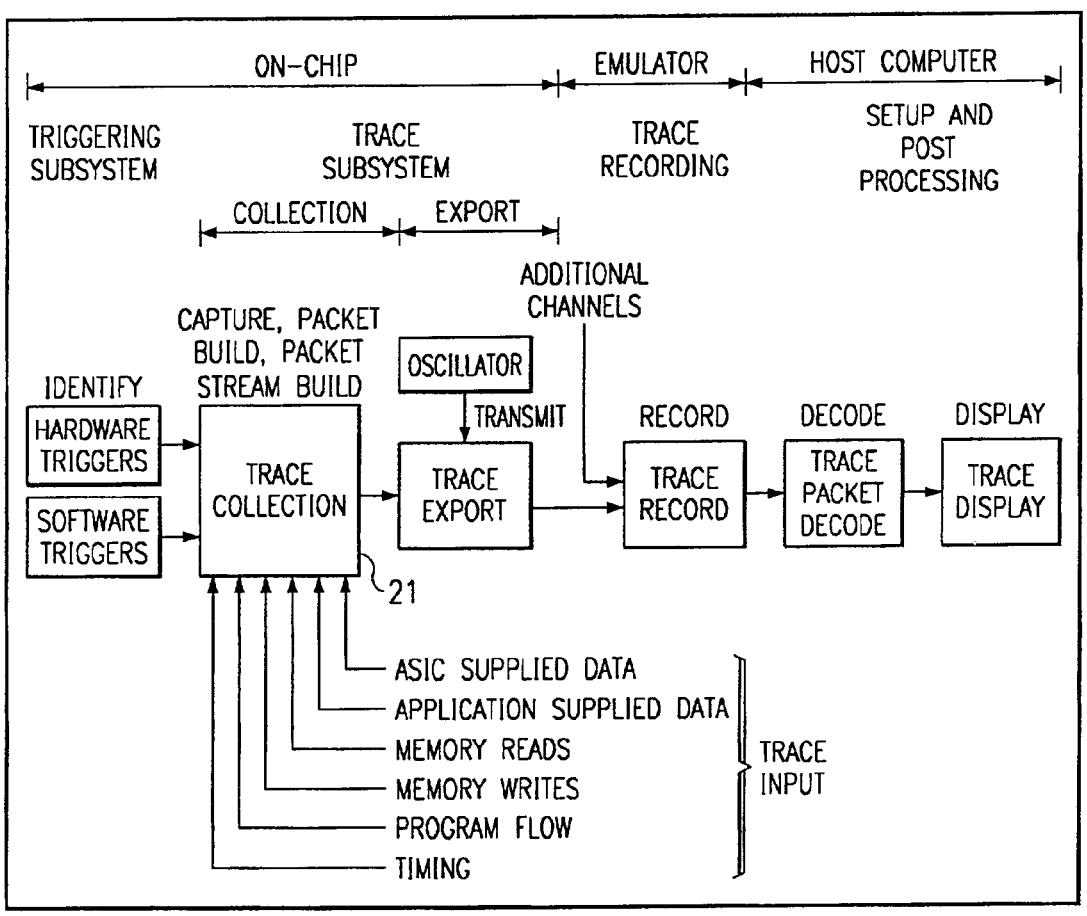
FIG. 2 diagrammatically illustrates portions of the emulation system of FIG. 1 in greater detail.

FIG. 2 diagrammatically illustrates pertinent portions of exemplary embodiments of a trace system within the emulation system of FIG. 1. As shown in FIG. 2, the trace system includes a triggering subsystem and a trace subsystem provided on a target chip, a trace recorder provided in the emulator and a setup and post processing portion provided in the host computer.

The triggering subsystem is operable for identifying hardware and software triggers, for example in any desired conventional manner. The trace subsystem includes a trace collection portion (or trace collector) 21 coupled to the triggering subsystem for receiving the hardware and/or software triggers. The trace collector also receives conventional trace input information from a plurality of sources (for example, timing information, program flow information, memory write information and memory read information), and produces therefrom a stream of trace packets including trace information. The trace subsystem further includes a trace export portion which receives the trace packet stream and formats it appropriately into a stream of transmission packets which are output from the trace export portion to suitable output pins (for example a debug port or a system bus port) of the target chip. The stream of transmission packets is delivered from the pin boundary of the target chip to a trace recorder within the emulator. The trace recorder (also referred to as a trace receiver) can be, for example, a dumb recording mechanism that merely records the trace stream provided from one or more trace channels (note the additional channels illustrated in FIG. 2). The host computer can retrieve the recorded packets at a later time, decode the retrieved packets in a trace packet decoder, and display the decoded packet information in a trace display.

Some exemplary embodiments of the trace collector 21 utilize 10-bit encoding to represent trace information such as program counter (PC) information, memory read information, memory write information and timing information. Other, wider encoding formats can also be used. Moreover, as explained in detail below, all of the aforementioned exemplary types of information can be transmitted to the emulator across the same pins of the target chip. The aforementioned 10-bit encoding results in 10-bit packets which can contain opcodes or data, or both opcodes and data. Each encoded packet contains an opcode that indicates the type of information that is being sent. Thus, for a 2-bit long opcode, the remaining 8 bits of the encoded packet will represent data associated with the 2-bit opcode. On the other hand, an encoded packet that includes a 10-bit opcode cannot include any data bits.

In many cases, additional data needs to be associated with a given opcode. For example, with a 2-bit opcode, only 8 additional bits are available in the current packet. If more than 8 additional bits are necessary to communicate the desired information, then the additional data bits can be included in subsequent packets, referred to herein as data packets or continue packets. A continue packet is uniquely identifiable, for example by having its two most significant bits set to define an opcode of 10. This opcode is referred to herein as the continue opcode. The data bits contained in a continue packet can represent information that is associated with a previous packet containing an opcode other than the 10 continue opcode.

A sequence of packets that begins with an opcode (i.e., other than a continue opcode) packet and includes all needed continue (or data) packets following the opcode packet is referred to herein as a command. The initial non-continue opcode is referred to as the command opcode. A command can have 0 or more parameters. Each parameter can be an independent piece of data associated with the command opcode. The number of parameters expected depends on the command opcode. Each parameter of a command can be encoded as a sequence of one or more packets, the first of which is identified by a "beginning of parameter" opcode, and the remainder of which are continue packets.

The interpretation of a command is dependent upon two factors, the command opcode and the number of parameters included in the command. In other words, for example, a command opcode packet has one meaning if it is immediately followed by another command opcode packet, but can have an entirely different meaning if it is immediately followed by continue packets. FIG. 3 illustrates exemplary trace packet formats according to the invention. As illustrated in FIG. 3, several of the opcodes are 10 bits long, and several others are less than 10 bits. In packets containing the less than 10-bit opcodes, the remaining bits (designated by x in FIG. 3) can be used for data transmission.

As shown in FIG. 3, the opcode 11 indicates a timing information packet. Each data (i.e. non-opcode) bit in a timing packet represents a single clock cycle of the target processor. Some timing packet examples are illustrated in FIG. 4. The first bit following the opcode (i.e. the leftmost bit) represents the latest clock cycle recorded in the timing packet, and the last (rightmost) bit represents the oldest clock cycle recorded in the timing packet. Furthermore, a data bit value of 0 in a timing packet indicates that an instruction or group of instructions executed during that clock cycle. A data bit value of 1 in a timing packet indicates that a wait state occurred, and that program execution was stalled during that clock cycle. This facilitates cycle accurate profiling on every instruction in a trace. Example timing packets are shown and described in FIG. 4.

In some embodiments, each instruction (or parallel instruction group) is represented with a single 0 bit. If a stall occurs during the execution of the instruction, the additional stalled cycles are represented with a bit value of 1. In such embodiments, the first cycle of execution will be represented with a bit value of 0, and all additional cycles will be represented with a bit value of 1.

The above-described timing packets according to the present invention permit the emulation system to "keep up with" target processor clock rates from, for example 300 MHz to 1.2 GHz, even though the trace export clock (provided, for example, by the oscillator of FIG. 2) used to output transmission packets from the pin boundary may operate at a clock rate (for example 200 MHz) that is significantly lower than the internal clock rate of the target processor core.

Referring again to FIG. 2, timing packets may occur at any point in the packet stream produced by the trace collector 21. For example, a timing packet can be inserted in the middle of a command without changing or affecting the emulator's understanding of that command. For example, data packets of the command which follow the inserted timing packet are treated as if the timing packet did not exist. This capability of inserting timing packets at any point in the packet stream advantageously reduces queuing of timing packets in the trace collector 21 prior to transmission.

Referring again to FIG. 3, a timing sync point packet can be utilized to indicate the relationship between the timing packets in the trace stream and other trace information in the trace stream. For example, the timing sync point illustrated in FIG. 5 can be utilized to relate the timing information in timing packets to PC trace information that is also being transmitted in packets of the packet stream. The timing sync point of FIG. 5 includes a timing sync header (i.e., opcode) and, in this example, a 3-bit PC sync ID. The timing sync point is used to mark a position in the stream of timing packets. The sync point is inserted into the timing packet stream before a timing packet that it marks. Like timing packets, a timing sync point packet can be inserted in the middle of other commands without interfering with the interpretation of the packets of those interrupted commands. The PC sync ID is used to match up with a corresponding PC sync point packet associated with a stream of PC trace packets.

Referring again to FIG. 3, a PC sync point can be utilized under various circumstances in a PC trace packet stream. There are several types of PC sync points for indicating several types of program events. For example, PC sync points can be used to mark: periodically generated PC and timing packet synchronization points; the start of a PC trace segment; or the end of a PC trace segment. Thus, any PC sync point includes both the opcode illustrated in FIG. 3 plus additional type code information as shown in FIG. 6, which type code information designates the reason for the PC sync point. FIG. 6 illustrates exemplary type codes for various types of PC sync points generated for various reasons, for example the first point of a PC trace stream, the last point of a PC trace stream, a periodically generated sync point, etc.

FIG. 7 illustrates an exemplary PC sync point command in more detail. As shown in FIG. 7, the PC sync point command includes a first packet which includes the PC sync point opcode and the type code of the PC sync point. After the initial, command opcode packet, a first continue packet is used to designate a PC sync ID. This PC sync ID will ultimately be used by the host computer to match the PC sync point command with a corresponding timing sync point having the same PC sync ID. In the same packet as the PC sync ID is a 3-bit time index parameter. In the packet stream produced by the trace collector 21 of FIG. 2, the first timing packet after a timing sync point holds the timing bits during which the corresponding PC sync point occurred. The 3-bit time index points to the bit in that timing packet that represents the first cycle of execution of the instruction at the PC specified in the PC sync point. For example, if the time index value is 000, then all of the bits in the timing packet immediately following the corresponding timing sync point correspond to cycles that were executed during or after the PC value specified in the last four packets of the PC sync point of FIG. 7.

FIG. 8 diagrammatically illustrates pertinent portions of exemplary embodiments of the trace collector 21 of FIG. 2. The trace collector of FIG. 8 includes a timing packet generator 81 for generating a stream of timing packets and a PC trace packet generator 82 for generating a stream of PC trace packets. The timing packet generator 81 receives the target processor clock as an input, and also receives execution information (i.e. execute or wait state) and responds to these inputs by producing timing packets as described above. The PC trace packet generator 82 is coupled to the PC register to receive therefrom PC addresses for inclusion in the PC trace packet stream. The PC trace packet generator 82 also receives trigger information indicative of when to start and stop PC trace activity, and also indicative of when to generate PC sync points within a PC trace packet stream. This trigger information, which can be produced in any desired manner, is also provided to the timing packet generator 81, so that the timing packet generator 81 will know when the PC trace packet generator 82 is producing a PC sync point, whereupon the timing packet generator 81 can produce a corresponding timing sync point and time index, and can forward the time index to the PC trace packet generator 82 for inclusion in the PC sync point.

When a PC sync point and corresponding timing sync point are generated, the timing packet generator 81 and the PC trace packet generator 82 access a table 83 of PC sync ID numbers, each packet generator obtaining the same ID number so that the timing sync point can be uniquely related to the PC sync point. With each new PC/timing sync point combination, the timing packet generator 81 and the PC trace packet generator 82 obtain a new ID number from the table 83.

The packet streams produced by the timing packet generator 81 and the PC trace packet generator 82 are applied to a stream combiner 85 which can combine the received packet streams, together with any other trace packet streams received from other trace collection activities, into a composite packet stream for output to the trace export portion of FIG. 2. As mentioned above, timing packets and timing sync points can be inserted at any point in the composite packet stream, but in general, a given command in the composite stream will not be interrupted by packets of another command. Using the opcode information of FIG. 3, the trace packet decoder of FIG. 2 can, for example, easily separate PC trace commands from other commands and from timing packets. The trace packet decoder can also easily detect the timing sync points and PC sync points, and can associate them properly by their PC sync ID's, thereby synchronizing the PC trace stream to the timing stream (and thus to the target processor clock).

FIG. 9 illustrates an exemplary packet sequence (command) used according to the present invention to describe a memory reference such as a memory read or memory write. A memory reference command is indicated by the 0011 opcode (see also FIG. 3). The LD/ST bit of FIG. 9 indicates whether the memory reference was a load (read) or store (write) instruction. The "Data, Address, PC" portion of the first packet includes encoded information regarding, for example, whether the data value of the load or store is included in the command, the size of any included data, the access size of the memory reference, whether the memory address of the load or store is included in the command, and whether the PC associated with the load or store is included as the native PC or as an offset from the last PC sync point. The remaining packets in the memory reference command of FIG. 9 convey the data that was loaded or stored, the data address associated with the load or store, and either the native PC address or the PC address expressed as an offset from the last PC sync point.

FIG. 9 also illustrates another exemplary feature of the trace packet formatting of the invention. In particular, and referring also to FIG. 3, the 01 opcode (for example) can have several different meanings depending on the context in which it is used. This opcode can be used, as in FIG. 9, to indicate the beginning of a parameter in a command. The number of parameters in a given command is specified by the opcode (for example the "Data, Address, PC" part of packet 91 in FIG. 9), so the occurrences of the 01 opcode to indicate the beginning of a parameter are expected at the trace decoder.

On the other hand, when the 01 opcode is found outside of a command, it conveys information about branches (see also FIG. 3). When one or more data (opcode 10) packets follow such an 01 opcode packet, the 01 opcode packet and following data packet(s) represent an indirect branch. Otherwise, the 01 opcode packet represents a relative branch.

FIG. 10 illustrates a memory reference sync point packet used to synchronize memory references such as illustrated in FIG. 9 with the program flow designated by the PC trace. The memory reference sync point of FIG. 10 is initiated in response to the production of a PC sync point by the PC trace packet generator 82 of FIG. 8. The memory reference sync point of FIG. 10 will thus appear in the composite packet stream after the PC sync point that initiated the memory reference sync point. Furthermore, the memory reference sync point will appear in the composite packet stream before any memory reference packets corresponding to instructions including and following the instruction associated with the PC sync point that initiated the memory reference sync point. As shown in FIG. 10, the memory reference sync point packet includes an opcode identifying it as a memory reference sync point (see also FIG. 2), and also includes the PC sync ID of the PC sync point that initiated creation of the memory reference sync point. A memory reference sync point need not be issued unless a corresponding memory reference packet needs to be issued, and should be issued before initiation of the corresponding memory reference packet sequence (such as the sequence illustrated in FIG. 9).

Figure 11:
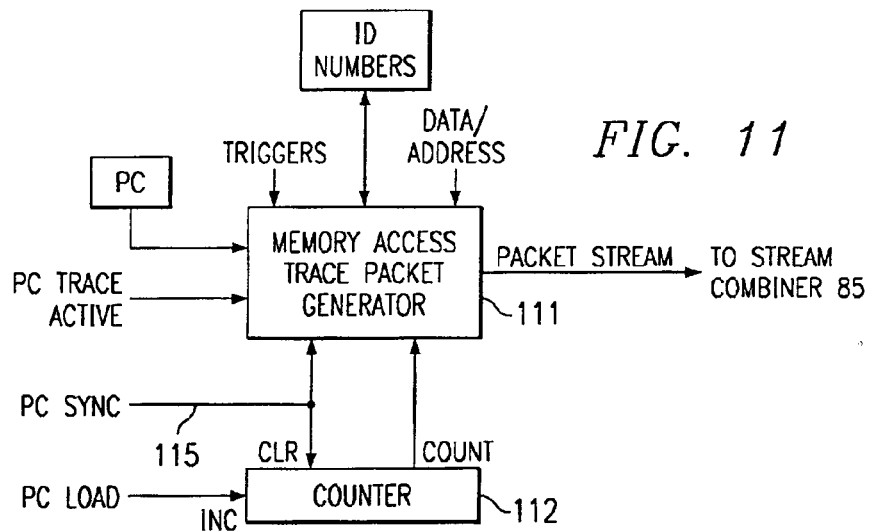
FIG. 11, considered in conjunction with FIG. 8, diagrammatically illustrates pertinent portions of further exemplary embodiments of the trace collector of FIG. 2.

FIG. 11, when taken in conjunction with FIG. 8, illustrates pertinent portions of further exemplary embodiments of the trace collector 21 of FIG. 2. The embodiment of FIG. 11 includes a memory access trace packet generator 111 which can produce a data/address trace packet stream (such as illustrated in FIG. 9) and a memory reference sync point (such as illustrated in FIG. 10). The memory access trace packet generator 111 of FIG. 11 is coupled for input from the PC register, and also receives data/address information 112 from the target processor core. The memory access trace packet generator 111 also receives trigger information, for example conventionally generated trigger information, which designates when to begin and end memory access trace activity. The memory access trace packet generator 111 is also coupled to the table of ID numbers at 83, so the memory reference sync point of FIG. 10 can be provided with the proper PC sync ID number.

In response to the trigger information, the memory access trace packet generator 111 can produce from the data/address information 112 a data/address trace packet stream. This packet stream is provided to the stream combiner 85 of FIG. 8, for inclusion in the composite packet stream of FIG. 8.

The packet generator 111 also receives at 115 information (e.g., from the PC trace packet generator 82 of FIG. 8) indicative of the issuance of a PC sync packet. In response to this information at 115, the memory access trace packet generator 111 retrieves the current PC sync ID number from the table 83, and produces (as needed) a memory reference sync point such as illustrated in FIG. 10. The occurrence of a PC sync point also clears a counter 112 that is incremented each time the PC register is loaded. Thus, the counter 112 provides a running record of the number of new PC loads since the last PC sync point. Thus, the count output of the counter 112 indicates a number of PC loads from which the current PC value is offset from the last PC sync point. Thus, when PC trace is active, indicated by signal 118 (for example from PC trace packet generator 82 of FIG. 8), the memory access trace packet generator 111 can, within a command such as illustrated in FIG. 9, identify the corresponding PC by this offset value rather than by the entire native PC value, which advantageously reduces the amount of information in (and hence the bandwidth required by) the memory reference command of FIG. 9. The native PC value can be included in the FIG. 9 command if PC trace is inactive.

Figure 12:
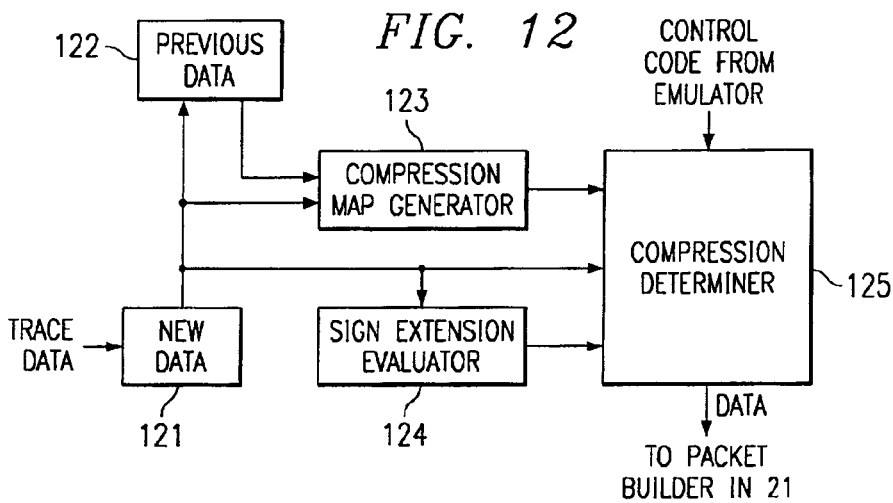
FIG. 12 diagrammatically illustrates exemplary embodiments of a data compressor which can be provided in the packet generators of FIGS. 8 and 11.

FIG. 12 diagrammatically illustrates pertinent portions of exemplary embodiments of a data compressor which can be provided in, for example, the memory access trace packet generator 111 of FIG. 11 or the PC trace packet generator 82 of FIG. 8. The data compressor of FIG. 12 includes a new data register 121 for receiving input trace data, and a previous data register 122 for receiving the current contents of new data register 121 when new trace data is received at the input of register 121. A compression map generator 123 has a pair of inputs respectively coupled to the previous data register 122 and the new data register 121. A sign extension evaluator 124 has an input coupled to the new data register 121. The compression map generator 123 has an output coupled to an input of a compression determiner 125, and the sign extension evaluator 124 has an output coupled to another input of the compression determiner 125. The compression determiner 125 has a further input coupled to the new data register 121.

The sign extension evaluator 124 determines in response to the new trace data in register 121 whether sign extension compression is applicable to the newly received trace data. If so, the sign extension evaluator 124 signals the compression determiner 125 appropriately to indicate the applicability of sign extension compression. The compression map generator 123 determines whether certain portions of the new data in register 121 are identical to corresponding portions of the trace data stored in previous data register 122. If so, then the compression map generator produces a compression map indicative of which portions of the new data are identical to corresponding portions of the previous data. Any identical portions of the new data need not be exported to the emulator (see also FIG. 2). The compression map is forwarded to the compression determiner 125.

The compression determiner 125 is operable in response to the respective outputs of the compression map generator 123 and the sign extension evaluator 124 to determine what, if any, compression is applicable to the new trace data in register 121. If any compression is applicable, the compression determiner 125 applies such compression to the new data in the data register 121, and outputs the compressed data to a packet builder portion of the trace collector 21 of FIG. 2, which packet builder portion inserts the compressed data into appropriate packets, for example any of the data-carrying packets illustrated in FIG. 3. On the other hand, if no data compression is applicable to the new trace data in register 121, the compression determiner 125 passes the new data in its original, uncompressed form to the packet builder portion. Advantageously, the compression determiner 125 can be selectively controlled to utilize only sign extension compression, or to utilize only the compression map information, or to utilize both sign extension compression and the compression map. This selective control can be implemented, for example, by scanning suitable control codes from the emulator into the compression determiner 125.

Figure 13:
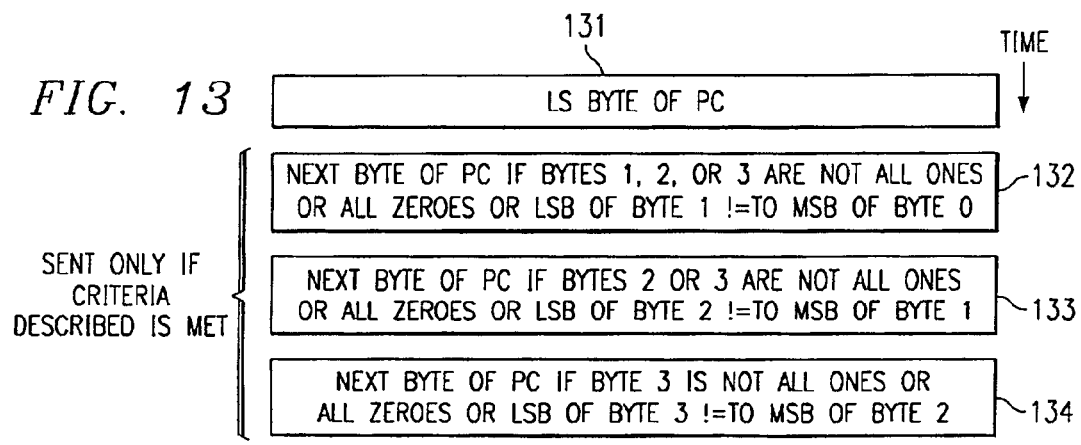

FIG. 13 illustrates an example of sign extension compression applied to a PC command. In the example of FIG. 13, byte 0 is the least significant byte of the PC, byte 1 is the next least significant byte of the PC, byte 2 is the next least significant byte of the PC, and byte 3 is the most significant byte of the PC. Also in this example, the opcodes are omitted for clarity. Byte 0 would ordinarily be sent in packet 131, byte 1 would ordinarily be sent in packet 132, byte 2 would ordinarily be sent in packet 133 and byte 4 would ordinarily be sent in packet 134. However, as shown in FIG. 13, byte 1 is only sent if its illustrated conditions are met, byte 2 is only sent if its illustrated conditions are met, and byte 3 is only sent if its illustrated conditions are met. Note also in FIG. 13 that the expression "!=" means "is not equal to". The sign extension evaluator 124 of FIG. 12 can, in some embodiments, evaluate new trace data for applicability of sign extension compression according to the exemplary criteria illustrated in FIG. 13.

FIGS. 14–18 illustrate further exemplary operations which can be performed by the data compressor of FIG. 12. In each of the examples in FIGS. 14–18, the compression determiner is programmed to use either the sign extension technique or the compression map technique, or both where applicable. In these examples, bytes 0–3 appear sequentially from right to left, and the bits within each byte progress right to left from least significant to most significant. In the example of FIG. 14, only byte 0 is transmitted, because sign extension compression is applicable to bytes 1–3. The packet decoder (see FIG. 2) knows that sign extension compression applies to the current bytes. A data compression map indicating that each byte of new data is identical to the corresponding byte of previous data could also have been sent, and the packet decoder in the host (see FIG. 2) would know the new data is all identical to the previous data. In this instance, either sign extension compression or a compression map would require transmission of a packet of information. Note that a compression map can be included in a given command as a continue packet following an initial header packet of the command, as illustrated generally in FIG. 19.

In FIG. 19, the data header packet at 190 could correspond to the packet 91 in FIG. 9 above, with the data compression map transmitted thereafter as a continue packet 192. Thereafter, as shown in FIG. 19, the data byte transmission proceeds analogously to that shown in FIG. 9. Considering specifically the data compression map shown in FIG. 19, this map is basically a byte (8 bits) of data wherein a bit value of 1 indicates that the corresponding new data byte is the same as the corresponding previous data byte, and therefore will not be sent, and wherein a bit value of 0 indicates that the corresponding new data byte differs from the corresponding previous data byte, and therefore will be transmitted. In FIG. 19, the shaded bytes correspond to the 0s in the data compression map, and only these bytes will be sent. The trace packet decoder in FIG. 2 can easily decode the data compression map and determine therefrom which bytes are being transmitted and which bytes are merely duplicated and therefore not transmitted.

In the example of FIG. 15, new byte 0 differs from previous byte 0, and the remaining new bytes are identical to the corresponding previous bytes. In this instance, sign extension compression is applicable, and only new byte 0 is transmitted. At the trace decoder, it is assumed that sign extension compression applies to all bytes that are expected but not received, namely bytes 1–3.

In the example of FIG. 16, only new byte 0 differs from the previous data, and sign extension compression is not applicable to bytes 1–3 of the new data. Accordingly, a compression map indicating that only byte 0 differs is transmitted along with byte 0 itself.

In the example of FIG. 17, new bytes 0 and 1 are the same as in the previous data, but new bytes 2 and 3 differ from the previous data. Moreover, sign extension compression applies to new bytes 2 and 3. In this instance, only a compression map is transmitted, indicating that new bytes 2 and 3 differ from their corresponding previous bytes. The trace packet decoder in the host computer will therefore know that bytes 0 and 1 are unchanged from the previous data and, because the decoder expects bytes 2 and 3 to be transmitted but does not receive them, it assumes that sign extension compression applies to new bytes 2 and 3. Thus, in the example of FIG. 17, the compressor of FIG. 12 would combine the compression map technique with the sign extension technique.

The example of FIG. 18 is similar to the example of FIG. 17. In particular, new bytes 0 and 1 are again identical to the previous data, new bytes 2 and 3 differ from the previous data, and sign extension compression applies to new bytes 2 and 3. Accordingly, a compression map is transmitted indicating that new bytes 2 and 3 differ from the previous data, but bytes 2 and 3 are not transmitted and the trace decoder assumes that sign extension compression is applicable to new bytes 2 and 3.

FIG. 20 illustrates a prior art approach to exporting emulation control information and emulation data from a target chip to an emulator. In the approach of FIG. 20, 9 pins of a debug port are apportioned to carry the emulation information, 5 pins for control information and 4 pins for data. This fixed apportionment between control information and data can cause bottlenecks when a large amount of data transmission bandwidth is required (quite commonly) or when a large amount of transmission bandwidth is needed for control information (less common but not unusual).

Figure 21:
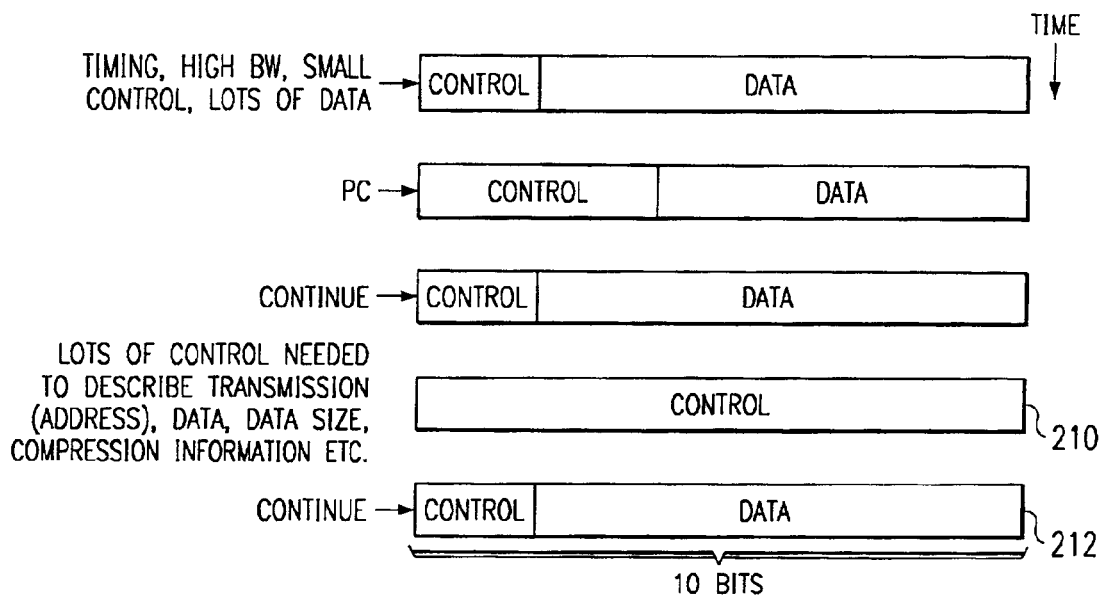
FIG. 21 illustrates exemplary operations which can be performed by the trace collector and data export collector of FIG. 2.

Referring now to FIG. 21, and continuing with the above-described exemplary 10 bit trace packet format (see FIG. 3), it can be seen that the present invention advantageously provides flexibility in its trace packet format such that the trace export bandwidth can be apportioned as needed under either data intensive transmission conditions or control intensive transmission conditions. For example, in the aforementioned continue packets, 2 bits of control are provided along with 8 bits of data. On the other hand, packets including 10 bits of control information can be provided as necessary, such as shown at 210. The packet 210 of FIG. 21 could correspond, for example, to the packet 91 described above with respect to FIG. 9, and the continue packet 212 of FIG. 21 could correspond, for example, to any of the data or address byte continue packets of FIG. 9. Thus, the packet format illustrated in FIG. 3 above, including the use of continue packets, advantageously provides for flexible allocation of control and data bandwidth within the export packet stream, thereby avoiding many of the bottlenecks associated with the prior art approach.

Figure 22:
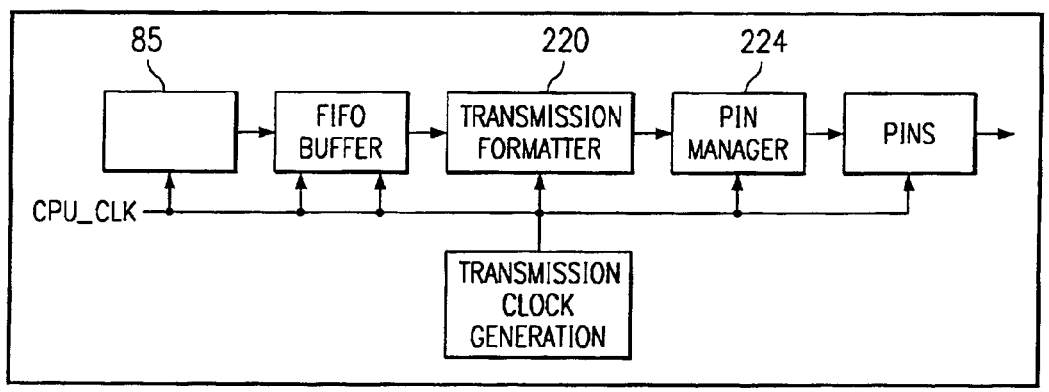
FIG. 22 diagrammatically illustrates pertinent portions of exemplary embodiments of the data export portion of FIG. 2.

FIG. 22 illustrates pertinent portions of exemplary embodiments of the trace export portion of FIG. 2. As shown in FIG. 22, the trace export portion includes a FIFO buffer coupled to a transmission formatter 220. The FIFO buffer receives the composite trace stream produced by the stream combiner 85 (see also FIG. 8). The transmission formatter 220 outputs a stream of transmission packets to a pin manager 224 which routes the packets to desired pins of, for example, a debug port on the target chip. Continuing with the above-described 10-bit trace packet example, the stream combiner 85 produces a composite stream of 10-bit trace packets. The trace export portion, including the FIFO buffer and transmission formatter 220, transforms the trace packets of the composite packet stream into a stream of transmission packets that can have a different bit width than the 10-bit trace packets. This stream of transmission packets is sent sequentially from the pin boundary of the target chip to the trace recorder of FIG. 2. The transmission packets can be delivered to the trace recorder via, for example, the debug port or another system bus port.

Advantageously, due to the use of the timing packets described above, the transmission clock associated with the transmission packets that are exported via the pin boundary to the emulator can be completely independent of the target processor (or core) clock. Thus, for example, when the target processor clock is relatively slow, for example a 67 MHz clock in a microcontroller chip, the transmission clock of FIG. 22 may be much faster than the target processor clock. This transmission clock can be generated, for example, based on a conventional scan clock utilized by a scan interface between the emulator and the target chip, and a transmission clock generated in this fashion could be substantially faster than a 67 MHz target processor clock. Under these circumstances, the transmission bandwidth required to export the 10-bit trace packets can be achieved using less than 10 pins of the target chip. For example, with a 200 MHz transmission clock, two 10-bit trace packets could be exported as five 4-bit transmission packets or four 5-bit transmission packets, while still keeping pace with internal target processor operations based on the 67 MHz target processor clock. Thus, in this example, five or six pins can be freed advantageously for other desired functions.

FIG. 23 illustrates another example wherein six 10-bit trace packets are transmitted as ten 6-bit transmission packets. The same data transmission rate can be achieved using narrower packets and correspondingly fewer pins because the transmission clock rate of FIG. 22 exceeds the target processor clock rate. For example, with a 66.7 MHz target processor clock rate and a 200 MHz transmission clock rate, the trace export portion of FIGS. 2 and 22 can convert three 10-bit trace packets into ten 3-bit transmission packets, and still keep up with the flow of 10-bit trace packets from the stream combiner 85.

FIGS. 23A and 23B illustrate operations where six 10-bit trace packets are transmitted as five 12-bit transmission packets (FIG. 23A), and where eight 10-bit trace packets are transmitted as five 16-bit transmission packets (FIG. 23B).

Figure 22A:
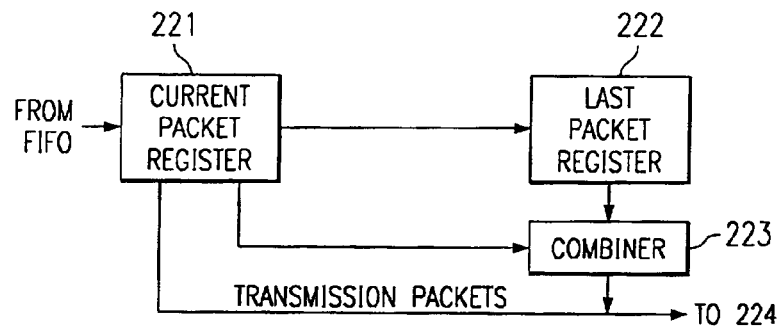
FIG. 22A diagrammatically illustrates pertinent portions of exemplary embodiments of the transmission formatter of FIG. 22.

FIG. 22A diagrammatically illustrates pertinent portions of exemplary embodiments of the transmission formatter 220 of FIG. 22. As shown in FIG. 22A, the transmission formatter 220 includes a current packet register 221 which receives the trace packets from the FIFO buffer. Also illustrated in FIG. 22A is a last packet register 222 which is merely a delayed version of the current packet register 221. In embodiments wherein the trace packet width is evenly divisible by the transmission packet width, for example a two or five bit transmission packet width and a ten bit trace packet width, then only the current packet register 221 is required. In the evenly-divisible case, the trace packet data is simply loaded into the current packet register and transmitted out in the narrower width packet format.

When the trace packet width is not evenly divisible by the transmission packet width, data from two consecutive trace packets must be combined to create some of the transmission packets. In such non-evenly-divisible embodiments, an additional register, namely the last packet register 222, is also utilized. A transmission packet is created from the contents of the current packet register 221, beginning with the least significant bits of the current packet register. After one or more transmission packets have been created from the current packet register bits, there will remain in the current packet register a number of bits which is smaller than the transmission packet width (i.e., the remainder when the trace packet width is divided by the transmission packet width). In this situation, a new trace packet is loaded into the current packet register 221. After this load, the current packet register 221 holds the new trace packet and the last packet register 222 holds the previous contents of the current packet register. A combiner 223 then combines the bits of the previous trace packet which were not transmitted (which bits are now contained in the last packet register 222) with as many of the least significant bits of the current packet register as are needed to complete the next transmission packet.

FIG. 24 illustrates exemplary operations which can be performed by the transmission formatter of FIG. 22A in order to convert from 10-bit trace packets to 6-bit transmission packets. In the example of FIG. 24, the shaded boxes represent the bits that are transmitted in a transmission packet, and each horizontal line represents one transmission clock cycle. The first 6 bits, namely bits 0–5 of the first 10-bit trace packet are transmitted, after which bits 6–9 of the first trace packet are transmitted along with bits 0 and 1 of the second trace packet, after which bits 2–7 of the second trace packet are transmitted, after which bits 8–9 of the second trace packet are transmitted along with bits 0–3 of the third trace packet, after which bits 4–9 of the third trace packet are transmitted, after which bits 0–5 of the fourth trace packet are transmitted. The 6-bit transmission packets are then readily re-formatted into the 10-bit trace packets by the trace packet decoder of FIG. 2.

Figures 25, 26, 27:
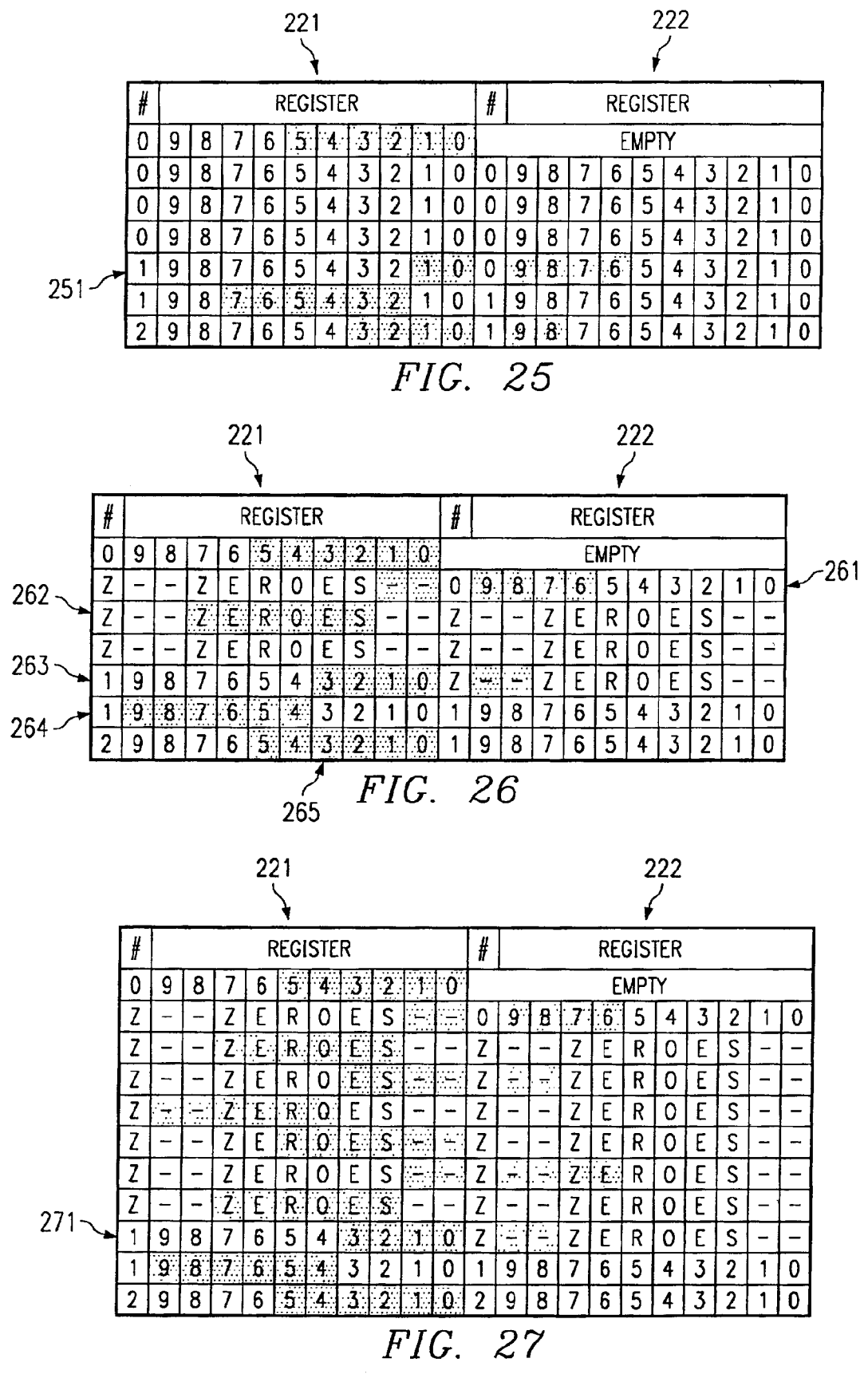

FIGS. 25–27 are similar to FIG. 24 and illustrate exemplary operations which can be performed by the transmission formatter of FIGS. 22 and 22A when additional trace packet data is required but none is available form the FIFO. In FIG. 25, the transmission formatter simply stalls until enough additional trace packet data (from the next trace packet) is available (at 251) to build a complete 6-bit transmission packet.

FIG. 26 illustrates another approach wherein all valid packet information is flushed by inserting a NOP trace packet into the trace packet stream, and continuing the transmission of packets until all valid trace packet information has been exported in a transmission packet (at 261). If no additional trace packet information becomes available for transmission, the transmission stalls. The NOPs are represented by 0s in FIG. 26. Once a complete NOP transmission packet (all 0's) has been exported at 262, transmission stalls until a new 10-bit trace packet is available at 263, whereupon the first 4 bits (bits 0–3) of that trace packet are combined with the last 2 bits of the inserted NOP packet to form a transmission packet. Thereafter, bits 4 through 9 of the new trace packet are exported as a transmission packet at 264, after which bits 0 through 5 of the next trace packet are exported as a transmission packet at 265.

FIG. 27 illustrates another approach according to the invention wherein NOPs are transmitted while no valid trace packets are available for transmission. The first three transmission cycles of FIG. 27 are identical to the first three transmission cycles of FIG. 26. However, in FIG. 27, NOP transmission packets are sequentially exported until the next valid trace packet arrives at 271 in FIG. 27. Cycle 271 and the following cycles of FIG. 27 are identical to cycle 263 and the following cycles of FIG. 26.

Although exemplary embodiments of the invention are described above in detail, this does not limit the scope of the invention, which can be practiced in a variety of embodiments.

What is claimed is:

1. A method of exporting from a data processor a plurality of parameter values of an emulation parameter that is indicative of a data processing operation performed by the data processor, comprising:

detecting a condition wherein a first portion of a first said parameter value is identical to a corresponding portion of a second said parameter value; and in response to detection of said condition, outputting, via terminals of the data processor, said second parameter value and only a remainder portion of said first parameter value other than said first portion of said first parameter value.

2. The method of claim 1, wherein said outputting step includes outputting information indicative of said condition.

3. The method of claim 2, wherein said condition information includes a compression map including a plurality of bits which respectively correspond to a plurality of portions of the emulation parameter and whose values indicate which of the respectively corresponding portions of the first parameter value are identical to corresponding portions of the second parameter value.

4. The method of claim 1, including detecting a further condition wherein a first group of bits within the remainder portion of the first parameter value all have the same bit value and a predetermined bit within a second group of bits in the remainder portion has a bit value equal to the bit value of the bits of the first group, and, in response to detection of said further condition, said outputting step including outputting from the data processor via the terminals thereof only the second group of bits of the remainder portion without outputting the first group of bits.

5. The method of claim 1, wherein said outputting step includes outputting said second parameter value and said remainder portion in a sequence of output information, and wherein said second parameter value precedes said remainder portion in said sequence.

6. The method of claim 5, wherein said outputting step includes outputting in said sequence information indicative of said condition.

7. The method of claim 6, wherein said condition information precedes said remainder portion in said sequence.

8. The method of claim 7, wherein said second parameter value precedes said condition information in said sequence.

9. The method of claim 6, wherein said second parameter value precedes said condition information in said sequence.

10. The method of claim 1, wherein said emulation parameter is program counter contents.

11. The method of claim 1, wherein said emulation parameter is a memory address.

12. The method of claim 1, wherein said emulation parameter is memory data.

13. The method of claim 1, wherein each of said first and second parameter values includes a plurality of bytes, said first portion includes a byte of said first parameter value, said remainder portion includes another byte of said first parameter value, and said corresponding portion includes a byte of said second parameter value.

14. The method of claim 13, wherein said first portion includes a plurality of further bytes of said first parameter value, and said corresponding portion includes a plurality of further bytes of said second parameter value.

15. The method of claim 1, including receiving said remainder portion and said second parameter value externally of the data processor, and recreating said first portion based on said second parameter value.

16. The method of claim 1, wherein said outputting step includes outputting information indicative of said condition, and further including receiving said remainder portion and said second parameter value and said condition information externally of the data processor, and recreating said first portion based on said condition information and said second parameter value.

17. An integrated circuit, comprising:

a data processor for performing data processing operations;

a plurality of terminals for outputting information;

an apparatus for exporting from said integrated circuit a plurality of parameter values of an emulation parameter that is indicative of a data processing operation performed by said data processor, said apparatus including an input coupled to said data processor for receiving said parameter values, and an information generator coupled to said input for detecting a condition wherein a first portion of a first said parameter value is identical to a corresponding portion of a second said parameter value, said information generator operable for providing information which indicates that said condition has been detected; and said apparatus further including a compression determiner coupled to said information generator and said input and said terminals, said compression determiner responsive to said condition information for outputting via said terminals said second parameter value and only a remainder portion of said first parameter value other than said first portion of said first parameter value.

18. The integrated circuit of claim 17, wherein said compression determiner is further operable for outputting said condition information via said terminals.

19. The integrated circuit of claim 18, wherein said condition information includes a compression map including a plurality of bits which respectively correspond to a plurality of portions of the emulation parameter and whose values indicate which of the respectively corresponding portions of the first parameter value are identical to corresponding portions of the second parameter value.

20. The integrated circuit of claim 17, wherein said apparatus further includes an evaluator coupled to said input for detecting a further condition wherein a first group of bits within said remainder portion of said first parameter value all have the same bit value and a predetermined bit within a second group of bits in the remainder portion has a bit value equal to the bit value of the bits of said first group, said evaluator operable for providing information which indicates that said further condition has been detected, said compression determiner coupled to said evaluator and responsive to said further condition information for outputting via said terminals only said second group of bits of said remainder portion without outputting said first group of bits.

21. The integrated circuit of claim 17, wherein said apparatus includes an information stream generator coupled between said compression determiner and said terminals for outputting said second parameter value and said remainder portion in a sequence of output information, and wherein said second parameter value precedes said remainder portion in said sequence.

22. The integrated circuit of claim 21, wherein said information stream generator is operable for outputting said condition information in said sequence.

23. The integrated circuit of claim 22, wherein said condition information precedes said remainder portion in said sequence.

24. The integrated circuit of claim 23, wherein said second parameter value precedes said condition information in said sequence.

25. The integrated circuit of claim 22, wherein said second parameter value precedes said condition information in said sequence.

26. The integrated circuit of claim 21, wherein said information stream generator includes a packet stream generator.

27. The integrated circuit of claim 17, wherein said emulation parameter is one of program counter contents, a memory address and memory data.

28. A data processing system, comprising:

an integrated circuit, including a data processor for performing data processing operations;

an emulation controller coupled to said integrated circuit for controlling emulation operation of said data processor;

said integrated circuit including an apparatus coupled between said data processor and said emulation controller for exporting from said integrated circuit a plurality of parameter values of an emulation parameter that is indicative of a data processing operation performed by said data processor, said apparatus including an input coupled to said data processor for receiving said parameter values, and an information generator coupled to said input for detecting a condition wherein a first portion of a first said parameter value is identical to a corresponding portion of a second said parameter value, said information generator operable for providing information which indicates that said condition has been detected; and said integrated circuit including a plurality of terminals coupled to said emulation controller for outputting information to said emulation controller, and said apparatus further including a compression determiner coupled to said information generator and said input and said terminals, said compression determiner responsive to said condition information for outputting to said emulation controller, via said terminals, said second parameter value and only a remainder portion of said first parameter value other than said first portion of said first parameter value.

29. The system of claim 28, including a man/machine interface coupled to said emulation controller for permitting a user to communicate with said emulation controller.

30. The system of claim 29, wherein said man/machine interface includes one of a visual interface and a tactile interface.

* * * * *